United States Patent
Then et al.

(10) Patent No.: US 11,476,345 B2
(45) Date of Patent: Oct. 18, 2022

(54) FERROELECTRIC-BASED FIELD-EFFECT TRANSISTOR WITH THRESHOLD VOLTAGE SWITCHING FOR ENHANCED ON-STATE AND OFF-STATE PERFORMANCE

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/907,445

(22) Filed: Jun. 22, 2020

(65) Prior Publication Data
US 2020/0321445 A1    Oct. 8, 2020

Related U.S. Application Data

(63) Continuation of application No. 16/080,822, filed as application No. PCT/US2016/025631 on Apr. 1, 2016, now Pat. No. 10,720,505.

(51) Int. Cl.
*H01L 29/51*    (2006.01)
*H01L 29/20*    (2006.01)
(Continued)

(52) U.S. Cl.
CPC ............ *H01L 29/516* (2013.01); *H01L 28/00* (2013.01); *H01L 29/2003* (2013.01);
(Continued)

(58) Field of Classification Search
CPC ............. H01L 29/516; H01L 29/78391; H01L 29/2003; H01L 29/6684; H01L 29/7786;
(Continued)

(56) References Cited

U.S. PATENT DOCUMENTS

| | | |
|---|---|---|
| 6,995,025 B2 | 2/2006 | Hsu et al. |
| 7,186,380 B2 | 3/2007 | Chen et al. |

(Continued)

FOREIGN PATENT DOCUMENTS

| | | |
|---|---|---|
| JP | 8-264669 | 10/1996 |
| JP | 2009283960 A1 | 12/2009 |

(Continued)

OTHER PUBLICATIONS

International Search Report and Written Opinion received for PCT Application No. PCT/US2016/025631, dated Dec. 8, 2016. 13 pages.

(Continued)

*Primary Examiner* — Igwe U Anya
(74) *Attorney, Agent, or Firm* — Schwabe, Williamson & Wyatt, P.C.

(57) ABSTRACT

Techniques are disclosed herein for ferroelectric-based field-effect transistors (FETs) with threshold voltage (VT) switching for enhanced RF switch transistor on-state and off-state performance. Employing a ferroelectric gate dielectric layer that can switch between two ferroelectric states enables a higher VT during the transistor off-state (VT,hi) and a lower VT during the transistor on-state (VT,lo). Accordingly, the transistor on-state resistance (Ron) can be maintained low due to the available relatively high gate overdrive (Vg,on−VT,lo) while still handling a relatively high maximum RF power in the transistor off-state due to the high VT,hi −Vg,off value. Thus, the Ron of an RF switch transistor can be improved without sacrificing maximum RF power, and/or (Continued)

vice versa, the maximum RF power can be improved without sacrificing the Ron. A ferroelectric layer (e.g., including $Hf_xZr_yO$) can be formed between a transistor gate dielectric layer and gate electrode to achieve such benefits.

22 Claims, 6 Drawing Sheets

(51) Int. Cl.
| | |
|---|---|
| *H01L 29/778* | (2006.01) |
| *H01L 49/02* | (2006.01) |
| *H01L 29/78* | (2006.01) |
| *H01L 29/66* | (2006.01) |
| *H01L 29/08* | (2006.01) |
| *H01L 29/423* | (2006.01) |

(52) U.S. Cl.
CPC ...... *H01L 29/6684* (2013.01); *H01L 29/7786* (2013.01); *H01L 29/78391* (2014.09); *H01L 29/0847* (2013.01); *H01L 29/4236* (2013.01)

(58) Field of Classification Search
CPC .. H01L 29/0847; H01L 29/4236; H01L 28/00
USPC ........................................................ 257/295
See application file for complete search history.

(56) References Cited

U.S. PATENT DOCUMENTS

| | | | |
|---|---|---|---|
| 2004/0001778 A1* | 1/2004 | Chen | B82Y 15/00 |
| | | | 422/88 |
| 2013/0270619 A1 | 10/2013 | Schloesser et al. | |
| 2014/0048796 A1 | 2/2014 | Baek | |
| 2014/0254274 A1* | 9/2014 | Shuto | G11C 11/223 |
| | | | 365/185.17 |
| 2015/0287802 A1* | 10/2015 | Lee | H01L 29/40111 |
| | | | 257/105 |
| 2015/0357429 A1* | 12/2015 | Dubourdieu | H01L 29/516 |
| | | | 257/295 |
| 2016/0035856 A1 | 2/2016 | van Bentum et al. | |
| 2016/0365435 A1 | 12/2016 | Then et al. | |
| 2017/0141235 A1 | 5/2017 | Lai et al. | |
| 2019/0058049 A1 | 2/2019 | Then et al. | |
| 2019/0131425 A1 | 5/2019 | Lu et al. | |
| 2020/0098925 A1 | 3/2020 | Dewey et al. | |

FOREIGN PATENT DOCUMENTS

| | | |
|---|---|---|
| KR | 20030057892 A | 7/2003 |
| KR | 20150082629 A | 7/2015 |
| TW | 200947705 A | 11/2009 |
| TW | 201545352 A | 12/2015 |
| WO | 2015/121534 A1 | 8/2015 |
| WO | 2015/147802 A1 | 10/2015 |
| WO | 2016024960 A1 | 2/2016 |
| WO | 2017/171851 A1 | 10/2017 |

OTHER PUBLICATIONS

International Preliminary Report on Patentability received for PCT Application No. PCT/US2016/025631, dated Oct. 11, 2018. 10 pages.

Office Action from Chinese Patent Application No. 201680083054.6, dated May 8, 2021, 21 pgs.

Tian Benlang, "Study on the effect of the dielectric property of the gate dielectrics on the performance of AlGaN/GaN MISHEMTs," China Doctoral Dissertations Full-text Database (E-Journals) IT album, May 31, 2014.

Office Action from Chinese Patent Application No. 201680083054.6, dated Jan. 12, 2022, 8 pgs.

Notice of Allowance from Chinese Patent Application No. 201680083054.6, dated Jul. 1, 2022, 5 pgs.

* cited by examiner

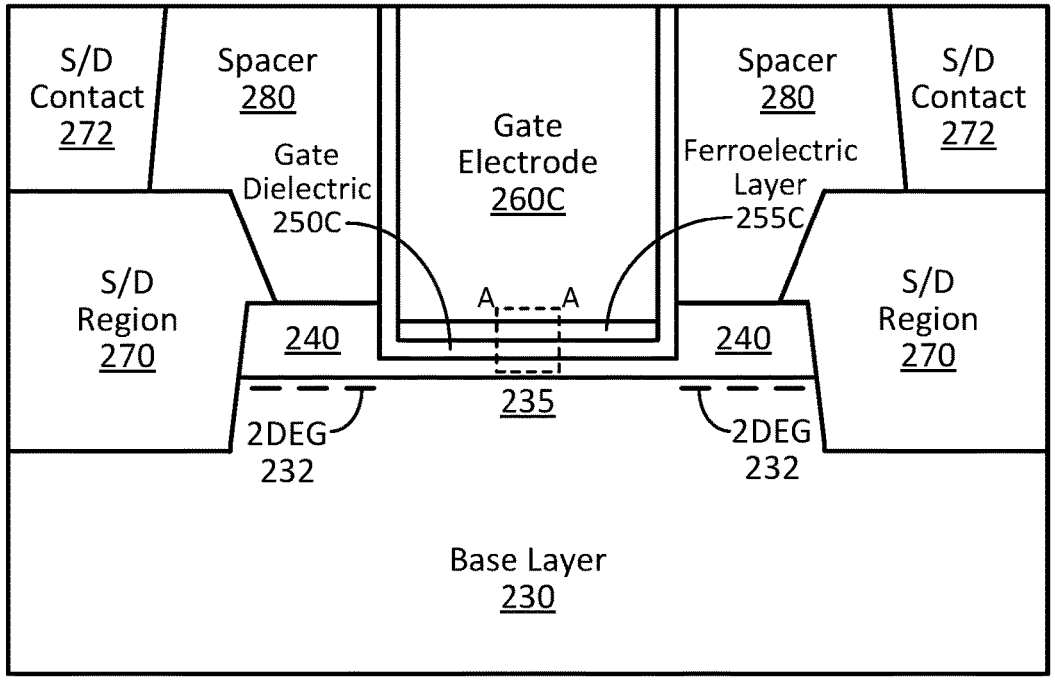
FIG. 4C
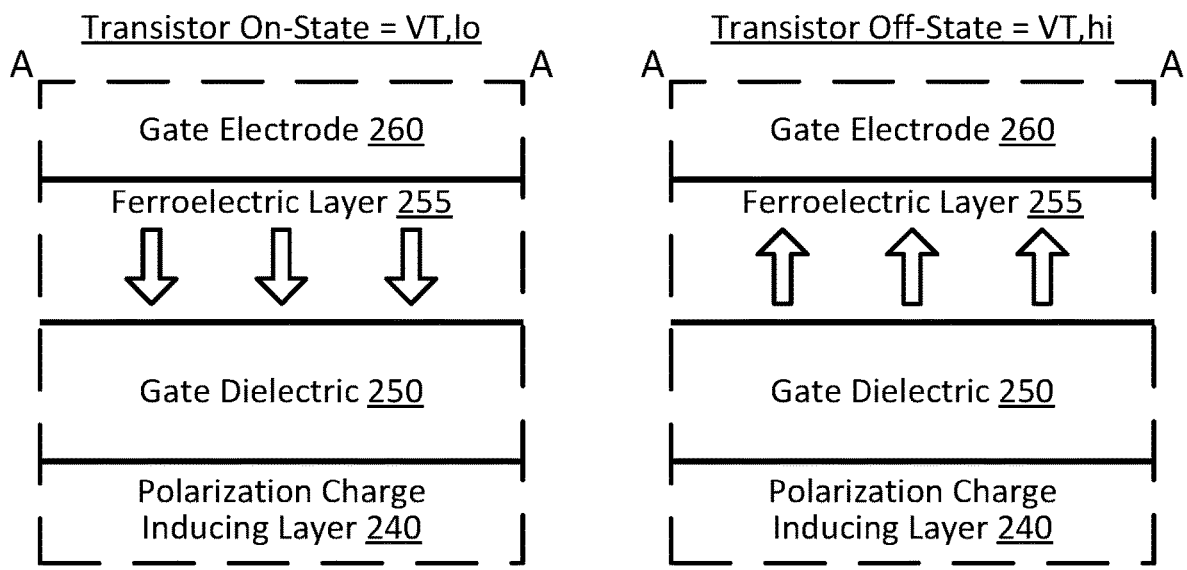
FIG. 5A  FIG. 5B

FERROELECTRIC-BASED FIELD-EFFECT TRANSISTOR WITH THRESHOLD VOLTAGE SWITCHING FOR ENHANCED ON-STATE AND OFF-STATE PERFORMANCE

CROSS-REFERENCE TO RELATED APPLICATIONS

This patent application is a Continuation of U.S. patent application Ser. No. 16/080,822, filed on Aug. 29, 2018, now U.S. Pat. No. 10,720,505 issued on Jul. 21, 2020, which is a U.S. National Phase Application under 35 U.S.C. § 371 of International Application No. PCT/US2016/025631, filed on Apr. 1, 2016, the entire contents of which are hereby incorporated by reference herein.

BACKGROUND

In the fields of wireless communication and power management, various components can be implemented using semiconductor devices such as transistors. For example, in radio frequency (RF) communication, the RF front end is a generic term for the circuitry between an antenna and a digital baseband system and the RF front end may include multiple transistor-based components, such as switches and amplifiers, to name some examples. Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall spacers (or so-called gate spacers) on either side of the gate that can help determine the channel length and can help with replacement gate processes, for example.

BRIEF DESCRIPTION OF THE DRAWINGS

FIGS. 4A-C illustrate example ferroelectric-based transistor structures similar to the example structure of FIG. 3, but including relative variations, in accordance with some embodiments of the present disclosure.

FIGS. 5A-B illustrate blown out views of the A-A dashed square portion indicated in the example structure of FIG. 4C, in accordance with some embodiments of the present disclosure. FIG. 5A corresponds to the ferroelectric-based transistor gate stack layers in the transistor on-state, while FIG. 5B corresponds to the ferroelectric-based transistor gate stack layers in the transistor off-state.

Figure 1A:
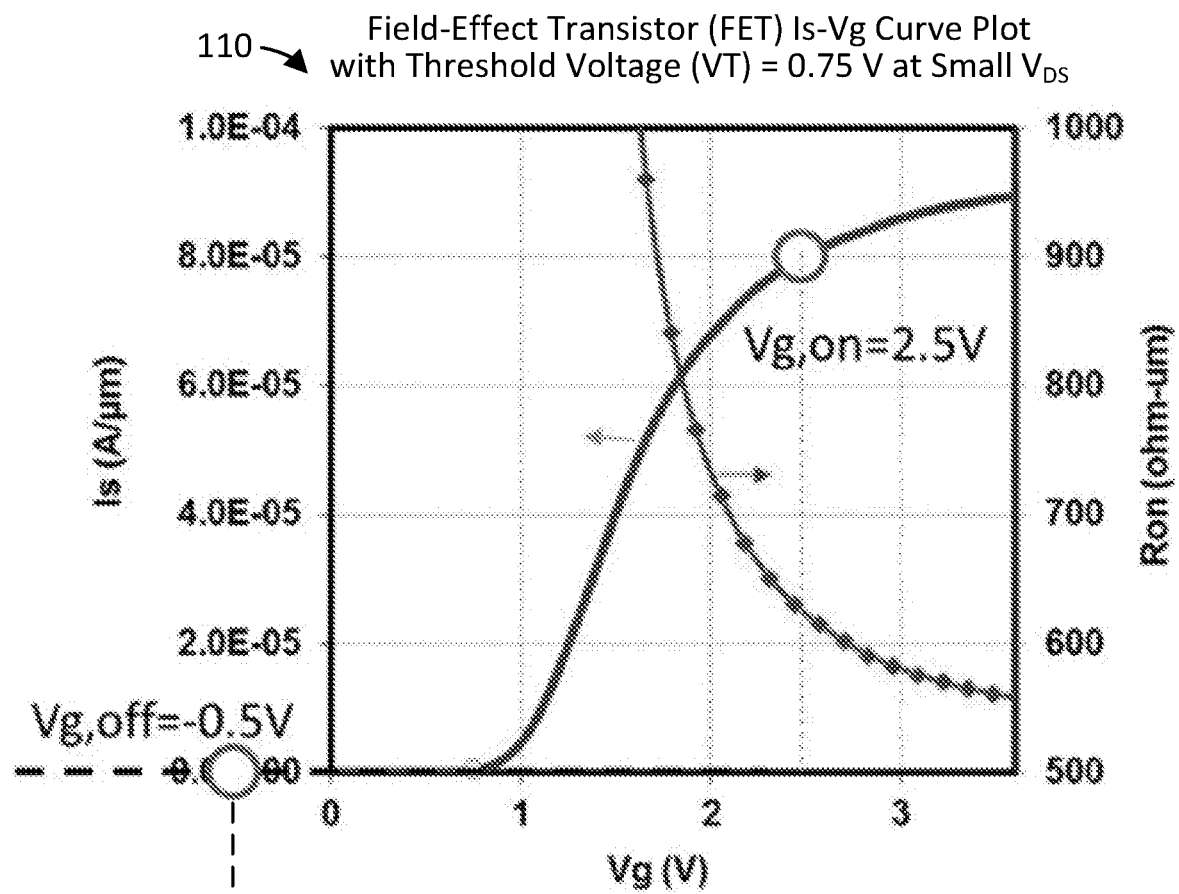
FIGS. 1A-D help illustrate the trade-off between an RF switch transistor on-state resistance (Ron) and maximum RF power that can be handled given a fixed supply voltage, such that the improvement of one traditionally leads to a degradation of the other.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Radio frequency (RF) switch transistor performance is characterized by its on-state resistance (Ron) and maximum RF power that can be handled given a fixed supply voltage. For example, the Ron of an RF switch transistor can determine the insertion loss as well as the ultimate size of the switch. The lower the Ron, the smaller the RF switch can be, and thus the more desirable for compact front-end solutions such as those in mobile handsets and RF base stations. The fixed negative supply voltage and threshold voltage determines the maximum voltage swing that can be accommodated by an RF switch, and thus the maximum RF power that can be handled by the RF switch. A switch in a mobile handset typically handles 1-2 W of RF power at the antenna. The large peak voltage that is required of a transistor-based RF switch is handled by stacking transistors in series. For example, silicon-on-insulator (SOI) configurations require 10-14 transistors to be connected in series to handle such large voltage swings that can peak at 30 V, for example. For transistor-based RF switches, it is desirable to minimize the number of transistors needed to be stacked in series in order to reduce the physical area of the circuit. For a field-effect transistor (FET) with a given supply voltage, Ron and max RF power are traditionally traded-off for each other, such that improving one leads to degradation in the other. Therefore, it would be desirable to improve the Ron of a transistor without sacrificing maximum RF power penalties, or vice versa, it would be desirable to increase the maximum RF power of a transistor without sacrificing RON penalties.

Figure 1B:
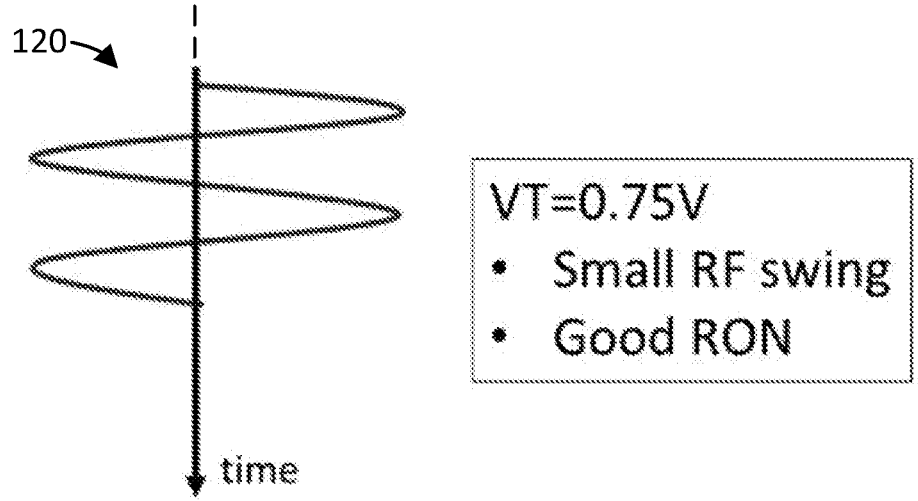
Figure 1C:
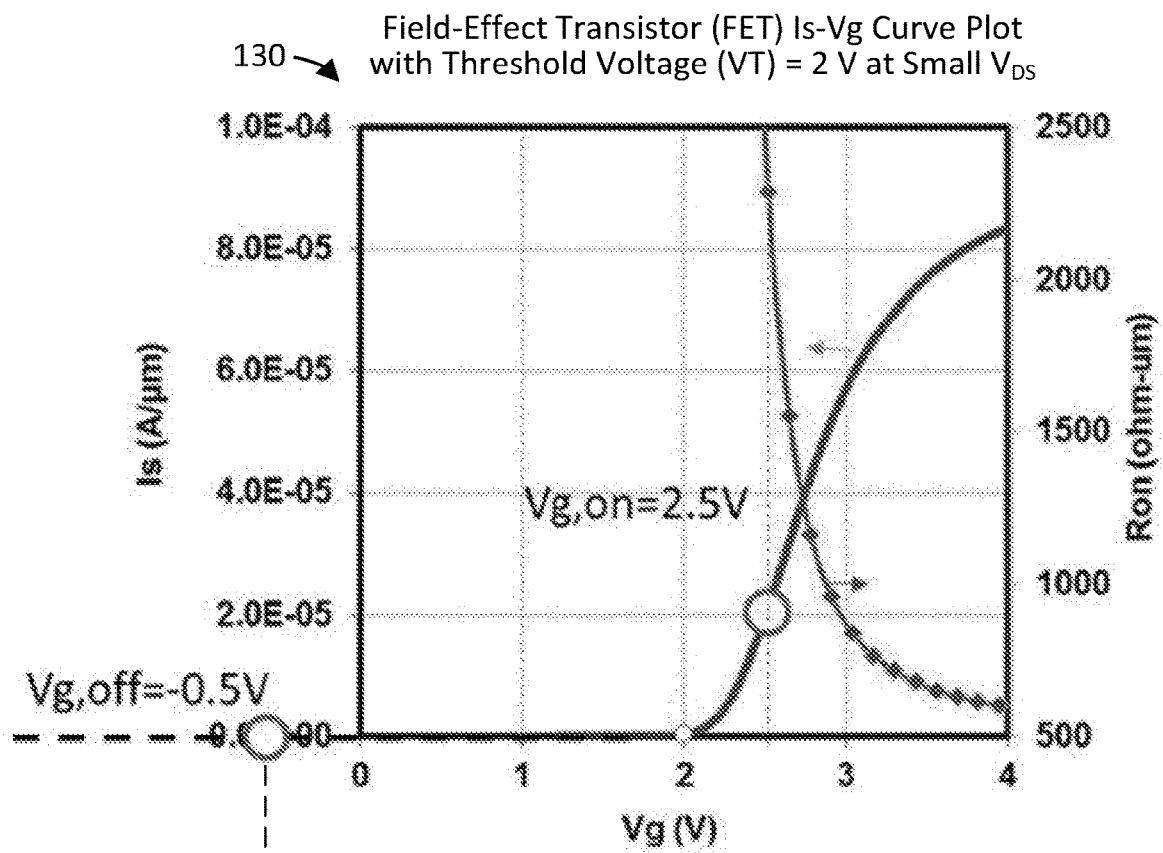
Figure 1D:
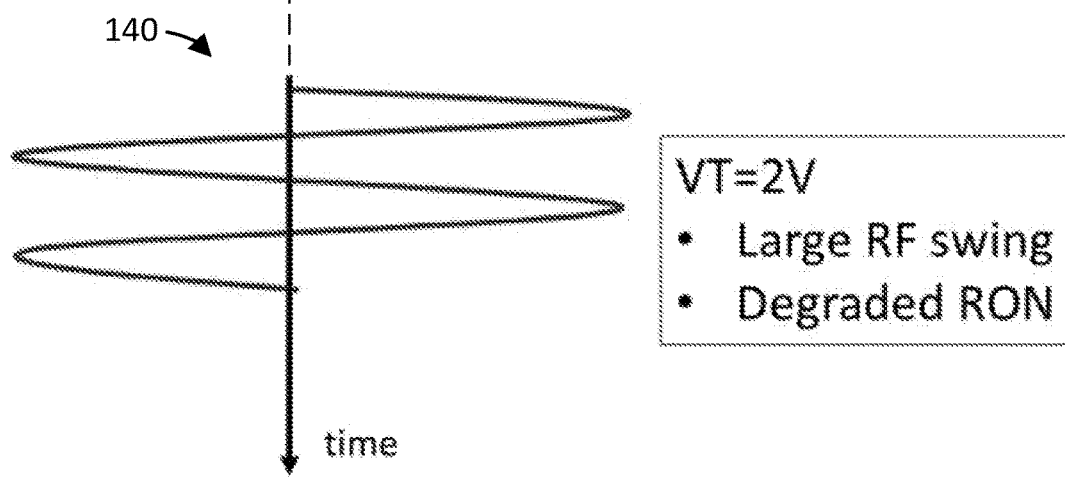

FIGS. 1A-D help further illustrate the aforementioned shortcomings associated with traditional RF switch field-effect transistors (FETs). FIG. 1A illustrates a FET Is-Vg curve plot 110 for a traditional FET with a threshold voltage (VT) of 0.75 V. Note that Is stands for the transistor source current and Vg stands for the transistor gate voltage. Also note that the curve including squares relates to Ron (in ohm-microns) and the other curve relates to Is (in amps/ microns), as indicated by the corresponding arrows. For illustration purposes, the voltage supply for this RF switch is fixed at 2.5 V for the on-state Vg (Vg,on) and −0.5 V for the off-state Vg (Vg,off). In this example case, the maximum RF swing voltage during the off-state has a peak-to-peak amplitude of 2(VT−Vg,off)=2(0.75 V−(−0.5 V))=2.5 V. A corresponding illustration 120 of the maximum RF swing voltage over time is shown in FIG. 1B. Ron is relatively good or suitable in this example case because of the large Vg,on−VT value, which is 2.5 V−0.75 V=1.75 V. FIG. 1C illustrates a second FET Is-Vg curve plot 130 for a traditional FET with a VT of 2 V. The other relevant parameters previously described for curve plot 110 equally apply to curve plot 130. In this example case, the maximum RF swing voltage has a peak-to-peak amplitude of 2(2 V−(−0.5V))=5V. A corresponding illustration 140 of the maximum RF swing voltage over time is shown in FIG. 1D. Accordingly, the maximum RF power handled in the off-state has increased from 2.5 V to 5 V as a result in the change in the VT. However, Ron is degraded because of the small Vg,on−VT value of 2.5 V−2 V=0.5 V. In other words, the increase/improvement in maximum RF power in the second case (illustrated in FIGS. 1C-D) as compared to the first case (illustrated in FIGS. 1A-B) leads to increased/degraded Ron. As can also be understood, conversely, the decrease/improvement in Ron in the first case as compared to the second case leads to decreased/degraded maximum RF power.

Thus, and in accordance with one or more embodiments of this disclosure, techniques are provided for ferroelectric-based field-effect transistors (FETs) with threshold voltage switching for enhanced RF switch transistor on-state and off-state performance. Ferroelectric materials are characterized as having a spontaneous electric polarization that can be reversed in response to the application of an external electric field. In some embodiments, employing a ferroelectric gate dielectric layer that can switch between two ferroelectric states enables a higher VT during the transistor off-state (VT,hi) and a lower VT during the transistor on-state (VT,lo). Accordingly, in such embodiments, Ron can be maintained relatively low during the transistor on-state due to the available high gate overdrive (Vg,on−VT,lo) while still handling a relatively high maximum RF power in the transistor off-state due to the high VT,hi−Vg,off value. Thus, in such embodiments, the Ron of an RF switch transistor can be improved without sacrificing maximum RF power, and/or vice versa, the maximum RF power can be improved without sacrificing the Ron. As will be apparent in light of this disclosure, a ferroelectric layer can be formed between the gate dielectric and the gate electrode of a transistor to achieve a VT,hi during the transistor off-state and a VT,lo during the transistor on-state. In some embodiments, the ferroelectric layer may include any suitable ferroelectric material, such as $Hf_xZr_yO$, $PbZrO_3$, $PbTiO_3$, $PbZr_xTi_{1-x}O_3$, $BaSr_{1-x}TiO_3$, $SrBi_2Ta_2O_9$, $BiLa_4Ti_3O_{12}$, $BaMgF_4$, $Bi_4Ti_3O_{12}$, and $Pb_5Ge_3O_{11}$, to name some examples. In some embodiments, the transistor channel material may include any suitable semiconductor material. For instance, in some such embodiments, the transistor channel material may include gallium nitride (GaN), as GaN includes wide bandgap and other desirable properties for an RF switch transistor, such as scaling properties that include relatively low Ron at a specified drain breakdown voltage, for example. Numerous variations and configurations will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit or transistor device having a gate stack structure configured as described herein. For example, in some embodiments, such structures may include a ferroelectric layer between the gate dielectric and the metal gate. Further, such a ferroelectric layer may be identified by first identifying a structure including the layer using cross-sectional analysis (e.g., using SEM, TEM, or STEM through a transistor), for example, and then performing analysis for composition of material on the structural layers (e.g., using composition mapping) to identify that the ferroelectric layer exhibits ferroelectric properties and/or includes ferroelectric material, such as one or more of the ferroelectric materials described herein. In some embodiments, the techniques and structures described herein can be used to produce high value-added RF functionalities at low incremental costs, as well as other benefits that will be apparent in light of this disclosure. In some embodiments, the ferroelectric-based RF switch FET structures provided herein may be detected, for instance, by measuring the benefits achieved, such as the improvement in Ron achieved without degrading the maximum RF power that can be handled by the device, and/or the improvement in maximum RF power that can be handled by the device without degrading the Ron. For instance, in some embodiments, the techniques and structures described herein can achieve up to a 75% reduction/improvement in Ron with no degradation in maximum RF power that can be handled, as will be apparent in light of this disclosure.

Architecture and Methodology

Figure 2:
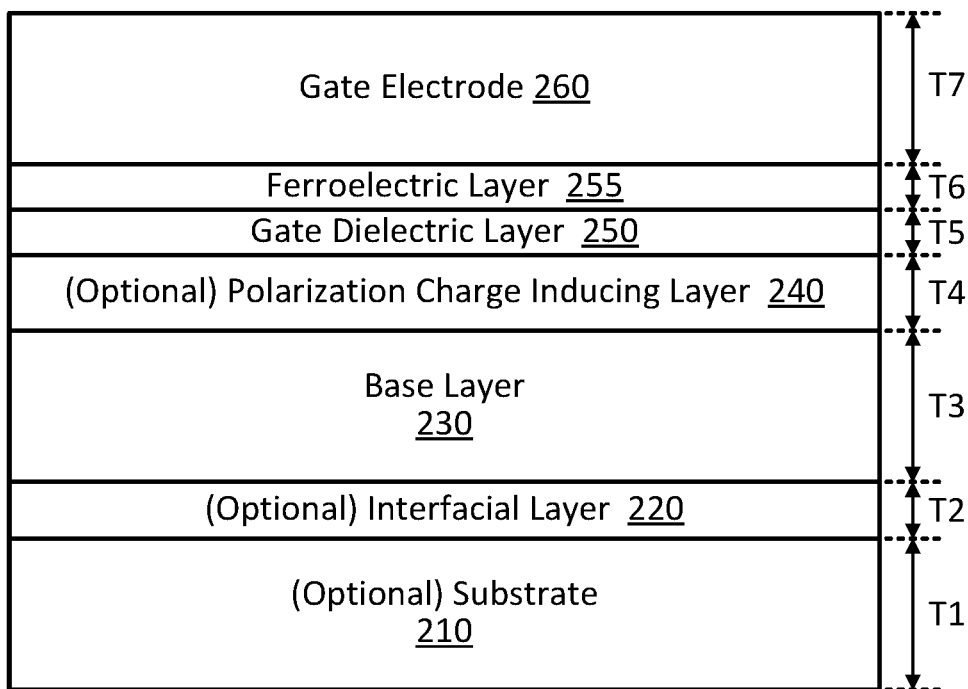
FIG. 2 illustrates an example stack of layers that may be used to form a ferroelectric-based transistor including a ferroelectric layer in the gate stack, in accordance with some embodiments of the present disclosure.
Figure 3:
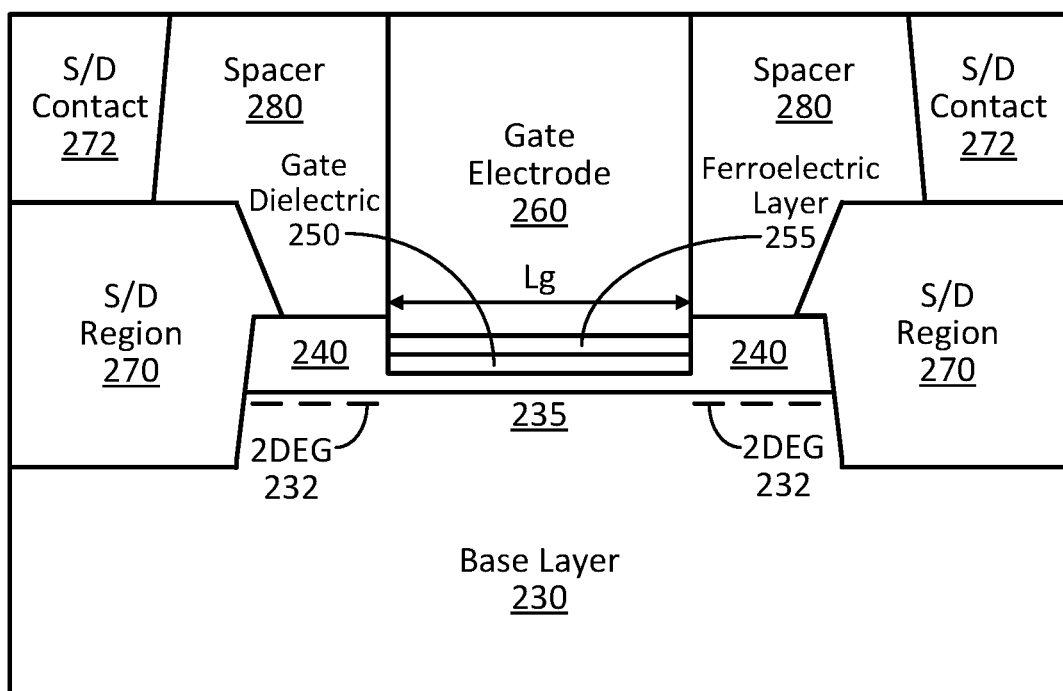
FIG. 3 illustrates an example ferroelectric-based transistor including a ferroelectric layer in the gate stack, in accordance with some embodiments of the present disclosure. Note that the structures shown is a cross-sectional view taken along the orthogonal-to-gate direction.

FIG. 2 illustrates an example stack of layers that may be used to form a ferroelectric-based transistor including a ferroelectric layer in the gate stack, in accordance with some embodiments of the present disclosure. FIG. 3 illustrates an example ferroelectric-based transistor including a ferroelectric layer in the gate stack, in accordance with some embodiments of the present disclosure. As will be apparent based on this disclosure, the example stack of layers shown in FIG. 2 may be used to form the example transistor structure of FIG. 3, in accordance with some embodiments. As will also be apparent in light of this disclosure, the transistor device of FIG. 3 may be used as an RF switch transistor or RF switch field-effect transistor (FET), which may be used in various components of the RF front end of a mobile device RF and/or RF base stations. The layers in the stack shown in FIG. 2 may be formed using any suitable techniques, such as one or more deposition or growth processes. In some embodiments, formation of one or more of the layers may be performed using metal-organic chemical vapor deposition (MOCVD), molecular-beam epitaxy (MBE) chemical vapor deposition (CVD), atomic layer deposition (ALD), physical vapor deposition (PVD), spin-on processing, or any other suitable process(es) as will be apparent in light of this disclosure. The structure of FIG. 3 is primarily depicted and described herein in the context of a planar FET configuration. However, in some embodiments, other transistor configurations can benefit from the techniques described herein. For example, the techniques may be used to form transistors having non-planar configurations, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), high-electron-mobility transistors (HEMTs), or other suitable transistor architectures, depending on the end use or target application. Further yet, in some embodiments, the techniques can be used to form integrated circuits including p-channel and/or n-channel transistor devices, such as p-channel MOSFET (PMOS), n-channel MOSFET (NMOS), p-channel TFET (PTFET), n-channel TFET (NTFET), p-channel HEMT (PHEMT), and/or n-channel HEMT (NHEMT), to name some examples. Further still, in some embodiments, the techniques may be used to benefit either or both of p-channel and n-channel transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

As shown in FIG. 2, base layer 230 is formed above optional substrate 210. As will be apparent based on this disclosure, in this example embodiment, base layer 230 will include the transistor channel region (e.g., channel region 235 shown in FIG. 3). Substrate 210 is optional, because in some embodiments, the base layer 230 may be a bulk wafer, such that the base layer is not formed above or on another material substrate but is instead used as the substrate itself, for example. However, in the example stack of layers shown in FIG. 2, substrate 210 is present and base layer 230 is formed above substrate 210. In some embodiments, substrate 210 (where present) may include: a bulk substrate including group IV material, such as silicon (Si), germanium (Ge), SiGe, or silicon carbide (SiC) and/or group III-V material and/or sapphire and/or any other suitable material (s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 210, in this example embodiment, is shown as having a thickness T1 (the vertical dimension or the stack of layers' main axis dimension) similar to the other features for ease of illustration, in some instances, substrate 210 may be much thicker than the other layers, such as having a thickness T1 in the range of 50 to 950 microns, for example. In some embodiments, substrate 210 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Optional interfacial layer 220, in some embodiments, may be present between base layer 230 and substrate 210, as will be apparent in light of this disclosure. For instance, in an example embodiment, where base layer 230 is a III-V material and formed on a substrate 210 that includes non-III-V material (e.g., on a Si, Ge, SiGe, SiC, or sapphire substrate), optional interfacial layer 220 may be formed between the III-V base layer and substrate to, for example, improve growth conditions and/or prevent the III-V base layer from reacting with the non-III-V substrate material. In such an example embodiment, interfacial layer 220 may be considered a nucleation layer. Further, in such an example embodiment, interfacial layer 220 may include a III-V material, such as AlN or a low temperature GaN layer (e.g., epitaxially grown at a temperature in the range of 700 to 950 degrees Celsius), for example. In another example embodiment, interfacial layer 220 may include an insulating material in an XOI configuration as previously described, where the insulating layer is sandwiched between base layer 230 and substrate 210 to, for example, reduce parasitic capacitance to the substrate. For instances, in such an example embodiment, an silicon on insulator (SOI) configuration may employ a silicon substrate and a silicon base layer, with an electrically insulating material layer between the silicon layers, where the insulating layer may include silicon dioxide or sapphire, for example. In some such embodiments, where interfacial layer 220 is an insulating layer, it may be a buried oxide (BOX) layer, for example. In some embodiments, optional interfacial layer 220 may have a multilayer structure including multiple material layers. In some embodiments, optional interfacial layer 220 may or may not include grading (e.g., increasing and/or decreasing) the content of one or more materials in at least a portion of the layer. Further, in some such embodiments, interfacial layer 220 (where present) may have any suitable thickness, such as a thickness T2 between 10 nm and 2 microns (e.g., 200 nm to 1 micron), or any other suitable thickness, depending on the end use or target application. Note that substrate 210 and interfacial layer 220 are not shown in the structure of FIG. 3 for ease of illustration. However, in some embodiments, one or both of the optional layers 210 and 220 may be present in the structure of FIG. 3, even though they are not shown.

Base layer 230, in some embodiments, may include any suitable material, including group IV material (e.g., Si, Ge, SiGe, SiC) and/or group III-V material (e.g., GaAs, InGaAs, GaN, InGaN), and/or any other suitable material, as will be apparent in light of this disclosure. In some embodiments, group III element-nitride (III-N) material may be particularly well-suited for base layer 230, as III-N materials have high (or wide) bandgaps and other desirable properties that serve well for the channel material of an RF switch transistor, for example. III-N materials, as variously used herein, include a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, base layer 230 may have a multilayer structure including multiple material layers. In some embodiments, base layer 230 may or may not include grading (e.g., increasing and/or decreasing) the content of one or more materials in at least a portion of the layer. In some embodiments, base layer 230 may be formed to have a thickness T3 between 50 nm and 2 microns (e.g., 200 to 800 nm), or any other suitable thickness, depending on the end use or target application. In embodiments where substrate 210 is not present and base layer 230 is a bulk wafer, then base layer 230 may be substantially thicker, such as greater than 100 microns in thickness, for example.

Optional polarization charge inducing layer 240, in some embodiments, may be present where base layer 230 includes III-V material, for example. For instance, in the example structure of FIG. 3, polarization charge inducing layer 240 is present as base layer 230 in that embodiment include III-V material. In some such embodiments, polarization charge inducing layer may include any suitable materials, such as one or more III-V materials, and more specifically in some embodiments, one or more III-N materials (e.g., GaN, InN, AlN, AlInN, AlGaN, InGaN, and/or AlInGaN), for example. In some embodiments, polarization charge inducing layer 240 (where present) may include aluminum and indium, such that the layer includes at least one of AlN, AlGaN, InAlN, and InAlGaN, for instance. In some embodiments, polarization charge inducing layer 240 may increase carrier mobility in the transistor channel region and/or be used to form two-dimensional electron gas (2DEG) configurations 232 with underlying III-V material layer, for example. Although 2DEG configurations include electron carriers and two-dimensional hole gas (2DHG) configurations include hole carriers, the term 2DEG will be used herein to generally refer to both carrier type configurations (both electron and hole carriers) for ease of description, unless otherwise stated. Therefore, in some instances, the 2DEG configurations 232, when the transistor is in an on-state (indicated in the structure of FIG. 3), may be considered a part of the channel region, as the 2DEG configurations 232 (along with region 235) allow charge carriers (e.g., electrons or holes) to flow from one source/drain (S/D) region to the other, depending on the end use or target application. In some cases, the thickness and/or composition of polarization charge inducing layer 240 may affect the magnitude of a polarization vector formed, and thus the amount of charge (and corresponding conductivity) in the 2DEG configurations 232, for example. In some embodiments, polarization charge inducing layer 240 need not be present, such as in embodiments where the base layer material (and thus, the channel region material) includes group IV semiconductor material, such as Si, Ge, SiGe, or SiC, for example. In some such embodiments, the channel region 235 of base layer 230 may be p-type or n-type doped to help enable the flow of charge carriers when the transistor is in an on-state and/or to help prevent the flow of charge carriers when the transistor is in an off-state, for example. In some embodiments, polarization charge inducing layer 240 (where present) may have a multilayer structure including multiple material layers. In some embodiments, polarization charge inducing layer 240 (where present) may or may not include grading (e.g., increasing and/or decreasing) the content of one or more materials in at least a portion of the layer. In some embodiments, polarization charge inducing layer 240 (where present) may have a thickness T4 between 0.1 to 100 nm (e.g., 0.5 to 5 nm), or any other suitable thickness, depending on the end use or target application.

Gate dielectric layer 250, in some embodiments, may include any suitable material, such as silicon dioxide and/or high-k dielectric material, depending on the end use or target application. As can be understood based on this disclosure, high-k dielectric material includes material having a dielectric constant, k, greater than that of silicon dioxide (e.g., a k value greater than approximately 3.9). Example high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the gate dielectric layer 250 to improve its quality when a high-k material is used, for example. In some embodiments, gate dielectric layer 250 may have a multilayer structure including multiple material layers. In some embodiments, gate dielectric layer 250 may or may not include grading (e.g., increasing and/or decreasing) the content of one or more materials in at least a portion of the layer. In some embodiments, gate dielectric layer 250 may have a thickness T5 between 0.1 and 40 nm (e.g., 1 to 10 nm), or any other suitable thickness, depending on the end use or target application.

Ferroelectric layer 255, as is described in more detail herein, allows the VT of the transistor structure of FIG. 3 to be decreased during the transistor on-state and increased during the transistor off-state. Ferroelectric layer 255, in some embodiments, may include any suitable material, such as one or more ferroelectric materials. Example ferroelectric materials include $Hf_xZr_yO$, $PbZrO_3$, $PbTiO_3$, $PbZr_xTi_{1-x}O_3$, $Ba_xSr_{1-x}TiO_3$, $SrBi_2Ta_2O_9$, $BiLa_4Ti_3O_{12}$, $BaMgF_4$, $Bi_4Ti_3O_{12}$, and $Pb_5Ge_3O_{11}$, to name some examples. Other suitable ferroelectric materials may include $Na_{0.5}Bi_{0.5}TiO_3$, $BaTi_{0.91}(Hf_{0.5},Zr_{0.5})_{0.09}O_3$ (BTHZ-9), $PbSc_xTa_{1-x}O_3$, $LiNbO_3$, $KNbO_3$, $GeTe$, $KNaC_4H_4O_6 \cdot 4H_2O$, $KTiOPO_4$, $Na_{0.5}Bi_{0.5}TiO_3$, and ferroelectric polymers such as polyvinylidene fluoride (PVDF), for instance. In some embodiments, ferroelectric layer 255 may be deposited using ALD, such as in cases of large scale integration, for example. In some embodiments, ferroelectric layer 255 may have a multilayer structure including multiple material layers. In some embodiments, ferroelectric layer 255 may or may not include grading (e.g., increasing and/or decreasing) the content of one or more materials in at least a portion of the layer. In some embodiments, ferroelectric layer 255 may have a thickness T6 between 1 and 100 nm (e.g., 5 to 20 nm), or any other suitable thickness, as will be apparent in light of this disclosure.

Gate electrode 260, in some embodiments, may include any suitable material, such as polysilicon, silicon nitride, silicon carbide, and/or various suitable metal material, such as aluminum (Al), tungsten (W), titanium (Ti), tantalum (Ta), copper (Cu), titanium nitride (TiN), or tantalum nitride (TaN), for example. In some embodiments, gate electrode 260 may have a multilayer structure including multiple material layers. In some embodiments, gate electrode 260 may or may not include grading (e.g., increasing and/or decreasing) the content of one or more materials in at least a portion of the layer. In some embodiments, gate electrode 260 may have a thickness T7 between 50 nm and 2 microns (e.g., 200 to 800 nm), or any other suitable thickness, depending on the end use or target application. In some embodiments, one or more additional material layers may be formed in the stack of FIG. 2. For instance, in some embodiments, an additional layer may be formed between polarization charge inducing layer 240 (where present) and gate dielectric layer 250, between gate dielectric layer 250 and ferroelectric layer 255, and/or between ferroelectric layer 255 and gate electrode 260 to increase the interface quality between the layers and/or to improve the electrical properties between the layers, for example. Such additional layers may include one or more work-function material layers, for example.

Source and drain (S/D) regions 270, in some embodiments, may be formed using any suitable techniques, depending on the end use or target application. As shown in the example structure of FIG. 3, S/D regions 270 were grown (or regrown) from polarization charge inducing layer 240, as that layer may have provided a relatively high-quality growth surface, particularly where the S/D regions 270 include III-V material, for example. However, any suitable techniques may have been used to form S/D regions 270. In some embodiments, S/D regions 270 may include any suitable material and any suitable doping scheme, such as being n-type doped or p-type doped using appropriate techniques and materials based on the S/D material and depending on the end use or target application. For example, in an embodiment where base layer 230 includes Si and the transistor device is configured to be a PMOS device, S/D regions 270 may both include p-type doped Si (e.g., where boron is the p-type dopant). In another example embodiment, where base layer 230 includes Si and the transistor device is configured to be an NMOS device, S/D regions 270 may both include n-type doped Si (e.g., where phosphorus is the n-type dopant). In another example embodiment, where base layer 230 includes III-V material, such as InGaN or GaN, S/D regions 270 may both include n-type doped InN or InGaN (e.g., where Si is the n-type dopant). In some embodiments, S/D regions 270 may have a multi-layer structure including multiple material layers. For instance, in some embodiments, a passivation material may be deposited prior to the deposition of the primary S/D material to assist with the quality of the interface between the S/D material 270 and the base layer 230 material. Further, in some embodiments, a contact-improving material may be formed on the top of the S/D regions 270 to assist with making contact to S/D contacts 272 (described below), for example. In some embodiments, S/D regions 270 may include grading (e.g., increasing and/or decreasing) the content of one or more materials in at least a portion of the regions.

S/D contacts 272, in some embodiments, may be formed using any suitable techniques, depending on the end use or target application. In some embodiments, S/D contacts 272 may include any suitable material, such as a conductive metal or alloy (e.g., aluminum, tungsten, silver, titanium, nickel-platinum, or nickel-aluminum). In some embodiments, S/D contacts 272 may include a resistance reducing metal and a contact plug metal, or just a contact plug, depending on the end use or target application. Example contact resistance reducing metals may include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contacts region 272, such as adhesion layers (e.g., titanium nitride) and/or liner or barrier layers (e.g., tantalum nitride), if so desired. In some embodiments, metallization of the S/D contacts 272 may be carried out, for example, using an alloying, silicidation, or germanidation process (e.g., generally, deposition of contact metal followed by annealing). Numerous S/D configurations will be apparent in light of this disclosure.

Spacers 280, in some embodiments, may be formed using any suitable techniques, depending on the end use or target application. In some embodiments, spacers 280 (also referred to as sidewall spacers or gate spacers) may include any suitable materials, such as electrical insulators, dielectrics, oxides (e.g., a silicon oxide material), and/or nitrides (e.g., a silicon nitride material). In some embodiments, spacers 280 may be formed prior to forming the gate stack (which includes gate dielectric layer 250, ferroelectric layer 255, and gate electrode 260, in this example embodiment) or after forming the gate stack. In some embodiments, spacers 280 may be used to help with replacement gate processing, such as a replacement metal gate (RMG) processing, for example. In some embodiments, spacers 280 may have a multi-layer structure including multiple material layers in the spacer regions. For instance, in an example embodiment, multiple vertical layers may be present in spacer regions 280, such that there are multiple layers of electrically insulating and/or dielectric material between the gate stack and each of the S/D regions and/or contacts. In addition, the structure shown in FIG. 3 may have isolation materials on the outside sides of the S/D regions, such as shallow trench isolation (STI) material, and interlayer dielectric (ILD) material on the outside sides of the S/D contacts, for example, where such STI and ILD material may include any suitable material, such as one of the materials listed as being suitable for spacer 280 material. As can also be seen in the structure of FIG. 3, the gate stack is above channel region 235 and the gate length is indicated as Lg. In some embodiments, the gate length Lg may be 50 to 150 nm (e.g., less than 100 nm), or have any other suitable length, depending on the end use or target application.

The stack of layers in FIG. 2 is provided for illustrative purposes and while the stack is used herein to help describe layers that may be present in the transistor structure of FIG. 3, in some embodiments, one or more layers in the stack may not be initially formed when forming the transistor structure of FIG. 3. For example, in some embodiments, a gate first or subtractive gate process flow may be used to form the transistor structure of FIG. 3, where the S/D regions 270 are formed prior to forming the transistor gate stack (which includes gate dielectric 250, ferroelectric layer 255, and gate electrode 260, in this example case). Further, in some embodiments, the process flow may include a gate last and replacement gate process, such as an RMG process, where a dummy gate (e.g., including a dummy gate oxide and dummy gate electrode such as dummy poly-Si) is formed, spacers 280 are formed adjacent to both sides of the dummy gate, and then the dummy gate material is removed and replaced with the gate stack shown in the example structure of FIG. 3. Regardless of whether the transistor fabrication process flow includes a gate-first flow, a gate-last flow, and/or a replacement gate process, any such transistor structure can benefit from including a ferroelectric layer 255 in the gate stack as described herein. Further, additional processing may be performed to complete the formation of one or more transistor devices, such as performing back-end-of-line interconnections, for example. Moreover, any suitable techniques may be used in the formation of the transistor structure of FIG. 3, such as using one or more of the deposition techniques described herein (e.g., MOCVD, MBE, CVD, ALD, PVD, spin-on processing) and/or any other suitable material deposition or growth techniques, one or more wet and/or dry etch processes and/or any other suitable material removal techniques, planarization and/or polish techniques, any suitable patterning or lithography techniques, implanting or diffusing or doping techniques, and so forth, depending on the end use or target application. Therefore, the techniques described herein are not intended to be limited to any specific method of transistor fabrication, unless otherwise stated.

Figure 4A:
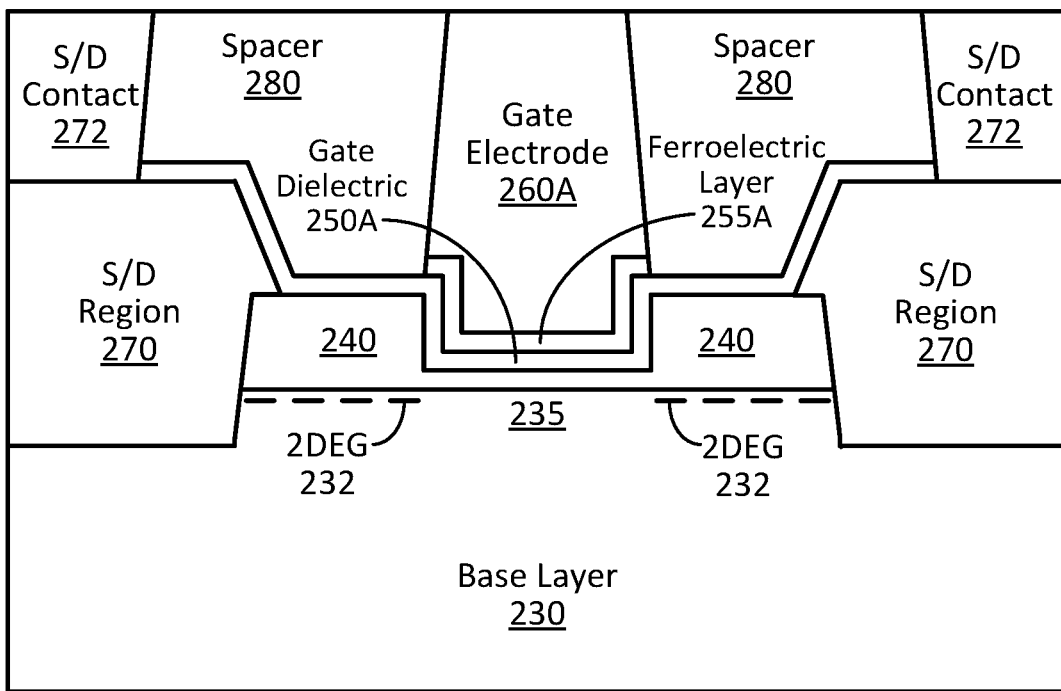
Figure 4B:
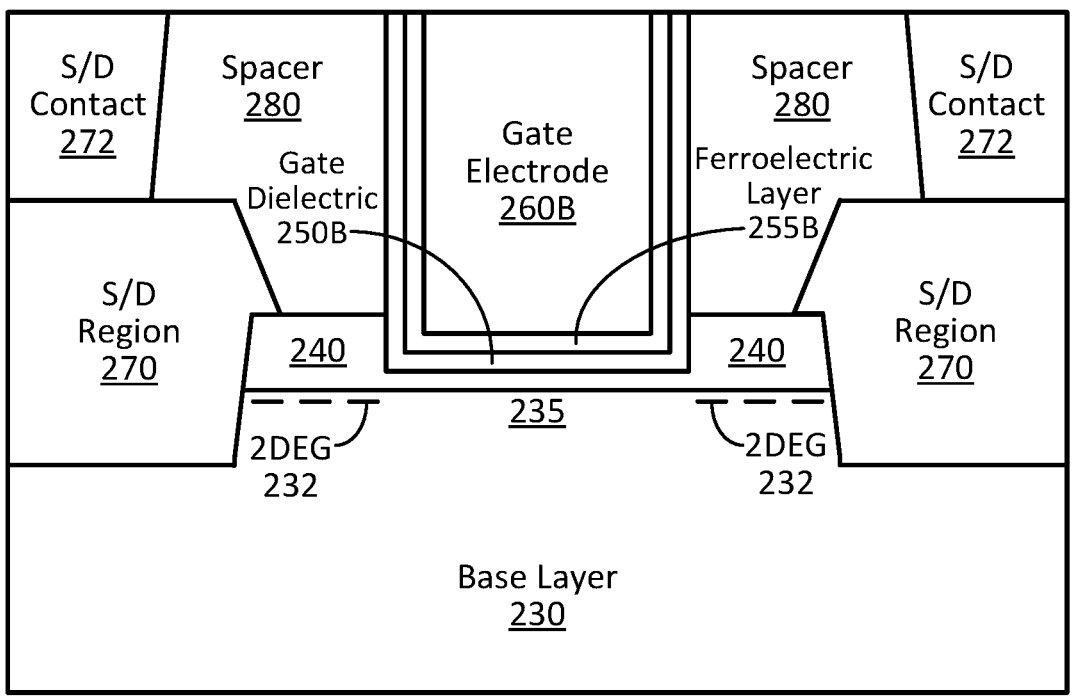

FIGS. 4A-C illustrate example ferroelectric-based transistor structures similar to the example structure of FIG. 3, but including relative variations, in accordance with some embodiments of the present disclosure. The previous relevant discussion with respect to the features of FIG. 3 that are similar in FIGS. 4A-C applies equally to those features, such as the previous relevant discussion with respect to base layer 230, polarization charge inducing layer 240, S/D regions 270, S/D contacts 272, spacers 280, and so forth. Note that the relative changes in the example structures of FIGS. 4A-C (compared to the structure of FIG. 3) primarily relate to one or more of the gate stack layers (gate dielectric layer 250, ferroelectric layer 255, and gate electrode 260), as will be understood based on this disclosure. Thus, the gate stack layers in FIGS. 4A-C are indicated with a respective A, B, or C as shown, such as FIG. 4A including gate dielectric layer 250A, ferroelectric layer 255A, and gate electrode 260A, and so forth. Numerous gate stack configurations will be apparent in light of this disclosure.

FIG. 4A is provided to illustrate structural variations related to the gate dielectric layer and gate electrode layer of the example ferroelectric-based transistor of FIG. 3, in accordance with some embodiments. For example, as can be seen in FIG. 4A, gate dielectric layer 250A is conformally formed on polarization charge inducing layer 240 and S/D regions 270, such that the material of gate dielectric layer 250A tracks the topography of the structure as shown. In such an example structure, gate dielectric layer 250A may have been blanket deposited after the S/D 270 regions were formed and before the S/D contacts 272 were formed. Therefore, in some embodiments, the gate dielectric layer (or the material of the layer) may be present below spacers 280. In addition, the example structure of FIG. 4A includes a gate electrode 260A having a different shape than that of gate electrode 260 in FIG. 3, for illustration purposes. Note that ferroelectric layer 255A is still between gate electrode 260A and gate dielectric 250A. For embodiments used in RF switch applications, the gate stack may be the same distance from both of the S/D regions (e.g., as is the case in FIG. 3); however, the present disclosure is not intended to be so limited. In some embodiments, the gate stack may be separated from each of the S/D regions by at least 5, 10, 15, 20, 25, 50, 75, or 100 nm, or some other suitable minimum distance, depending on the end use or target application. Note that the distance between the gate stack and each of the S/D regions may also affect the lengths of the 2DEG configurations 232, as can be understood based on this disclosure.

FIGS. 4B-C are provided to illustrate structural variations related to the gate trench engineering of the example ferroelectric-based transistor of FIG. 3, in accordance with some embodiments. For example, as can be seen in the example structure of FIG. 4B, both gate dielectric layer 250B and ferroelectric layer 255B were formed on the sidewalls of the gate trench region (e.g., the region between spacers 280), and the material of the two layers 250B and 255B remains on the sidewalls of that region. In other words, in this example embodiment, the gate dielectric layer 250B and ferroelectric layer 255B are between the gate electrode 260B and each of the spacers 280, such that gate electrode 260B is no longer directly adjacent to (or in physical contact with) spacers 280. However, in this example embodiment, the spacers 280 are still adjacent to both sides of gate electrode 260B, except there are now intervening layers, as shown. As shown in the example structure of FIG. 4C, ferroelectric layer 255C is not on the sidewalls of the gate trench region, as the ferroelectric layer material 255C may have only been formed on the bottom of the gate trench region as shown or the ferroelectric layer material may have been formed in other areas of the gate trench region but subsequently removed (e.g., using wet and/or dry etch processing) prior to depositing gate electrode material 260C, for example. In other words, in this example embodiment, the gate dielectric layer 250C (but not ferroelectric layer 255C) is between the gate electrode 260C and each of the spacers 280, such that gate electrode 260C is no longer directly adjacent to (or in physical contact with) spacers 280. However, in this example embodiment, the spacers 280 are still adjacent to both sides of gate electrode 260C, except there is now an intervening layer, as shown. In some embodiments, it may be advantageous to not have the ferroelectric layer on the sidewalls of the gate trench region (as is the case in the example structure of FIGS. 3, 4A, and 4C), as the ferroelectric layer may contribute to parasitic capacitance between the gate and each of the S/D regions, for example.

FIGS. 5A-B illustrate blown out views of the A-A dashed square portion indicated in the example structure of FIG. 4C, in accordance with some embodiments. As shown, the A-A dashed square portion includes the gate stack layers of gate dielectric 250, ferroelectric layer 255, and gate electrode 260. Note that the three layers will be referred to generally as 250, 255, and 260 for ease of description, but that the A-A dashed square portion applies equally to layers 250A-C, 255A-C, and 260A-C, respectively, as can be understood based on this disclosure. As can be seen, FIG. 5A corresponds to the gate stack layers in the transistor on-state, while FIG. 5B corresponds to the gate stack layers in the transistor off-state. As can be understood based on this disclosure, when the transistor is in an on-state (shown in FIG. 5A), the ferroelectric layer 255 is in a first ferroelectric state (indicated with the arrows pointing downward toward the gate dielectric layer 250), thereby effecting a relatively lower threshold voltage (VT,lo). Further, when the transistor is in an off-state (shown in FIG. 5B), the ferroelectric layer 255 is in a second ferroelectric state (indicated with the arrows pointing upward toward the gate electrode 260), thereby effecting a relatively higher threshold voltage (VT, hi), where VT,hi is greater than VT,lo. In some embodiments, this ferroelectric state switching effect provides the benefits described herein. In some embodiments, the difference in VT,hi and VT,lo may be at least (VT,hi–VT,lo): 0.5, 1, 1.5, 2, 2.5, 3, 3.5, 4, 4.5, or 5 V, or any other suitable minimum value, as will be apparent in light of this disclosure.

Although the techniques and structures described herein with reference to FIGS. 2, 3, and 4A-C primarily related to a ferroelectric-based transistor having a planar configuration, the techniques can be applied to form transistors of varying configurations. For example, in some embodiments, the techniques may be used to form transistors having non-planar configurations, such as a dual-gate configuration, a tri-gate configuration, or a gate-all-around (GAA) configuration (e.g., including one or more nanowires or nanoribbons). Further, the techniques can be applied to benefit various different transistor types, such as metal-oxide-semiconductor field-effect transistors (MOSFETs), tunnel FETs (TFETs), high electron mobility transistors (HEMTs), to name a few examples. Further still, the techniques can be applied regardless of the transistor doping schemes used. For example, in the case of a MOSFET configuration, the channel region may be doped in a type opposite from the adjacent S/D regions, such as an n-channel MOSFET (NMOS) configuration that includes n-type doped S/D material and p-type doped channel material, or a p-channel MOSFET (PMOS) configuration that includes p-type doped S/D material and n-type doped channel material. In the case of a TFET configuration, the S/D regions may be oppositely typed doped (where one is n-type doped and the other is p-type doped) and the channel material may be minimally doped or undoped/intrinsic. Further note that the techniques can be used to benefit one or both of the n-channel and p-channel transistors included in a complementary device, such as one or both of the NMOS and PMOS transistors included in a complementary MOS (CMOS) device, for example. Accordingly, the techniques described herein are not intended to be limited to any particular transistor configuration, unless otherwise stated. Numerous variations and configurations will be apparent in light of this disclosure.

Benefits of Ferroelectric Layer

In some embodiments, the ferroelectric-based transistor structures described herein may be used as an RF switch transistor. In such embodiments, the RF signal is input into the drain of the transistor and the output signal goes through the transistor source, and vice versa. In an example embodiment where the transistor channel layer (or base layer 230) includes GaN, the ferroelectric-based GaN RF switch transistor can be compared to a non-ferroelectric-based GaN RF switch transistor (where a ferroelectric layer is not present in the gate stack) to show the benefits of including a ferroelectric layer in the gate stack as described herein. In an example case where the voltage supply or gate voltage for the transistor on-state (Vg,on) is 2.5 V, the threshold voltage (VT) in the transistor off-state (VT,off) is 2V, the VT in the transistor on-state is expressed as VT,on, the resistance in the on-state is expressed as Ron, and the number of transistors in the stack for the example RF switch devices being compared is 3, the following table applies:

|  | Non-Ferroelectric-Based GaN RF Switch Transistor | Ferroelectric-Based GaN RF Switch Transistor |
| --- | --- | --- |
| Vg, on | 2.5 V | 2.5 V |
| VT, on | 2 V | −0.5 V |
| Vg − VT, on | 0.5 V | 3 V |
| Ron | 2288 ohm-microns | 582 ohm-microns |
| # of Transistors in Stack | 3 | 3 |
| Series Ron | 6864 ohm-microns | 1746 ohm-microns |
| Ron Improvement |  | ~75% reduction |

As can be understood by the above table comparison, the example case illustrates that the inclusion of a ferroelectric layer in the gate stack of each RF switch transistor, as described herein, with all else being equal, results in an approximately 75% reduction in Ron. Further, the 75% reduction in Ron is achieved without sacrificing the maximum RF power able to be handled during the transistor off-state, as VT,off in this example case is 2V for both example transistors. Moreover, the nominal reduction in Ron achieved by using a ferroelectric-based RF switch transistor as described herein is proportionately increased by the number of transistors included in a stack for an RF switch device. This is possible due to the ferroelectric switching that occurs in the ferroelectric layer between the transistor on and off-states (described with reference to FIGS. 5A-B), thereby effecting a VT,off that is relatively higher than VT,on, such that VT,off=VT,hi and VT,on=VT,lo for such ferroelectric-based RF switch transistors. Numerous benefits of the techniques and structure described herein will be apparent in light of this disclosure.

Example System

Figure 6:
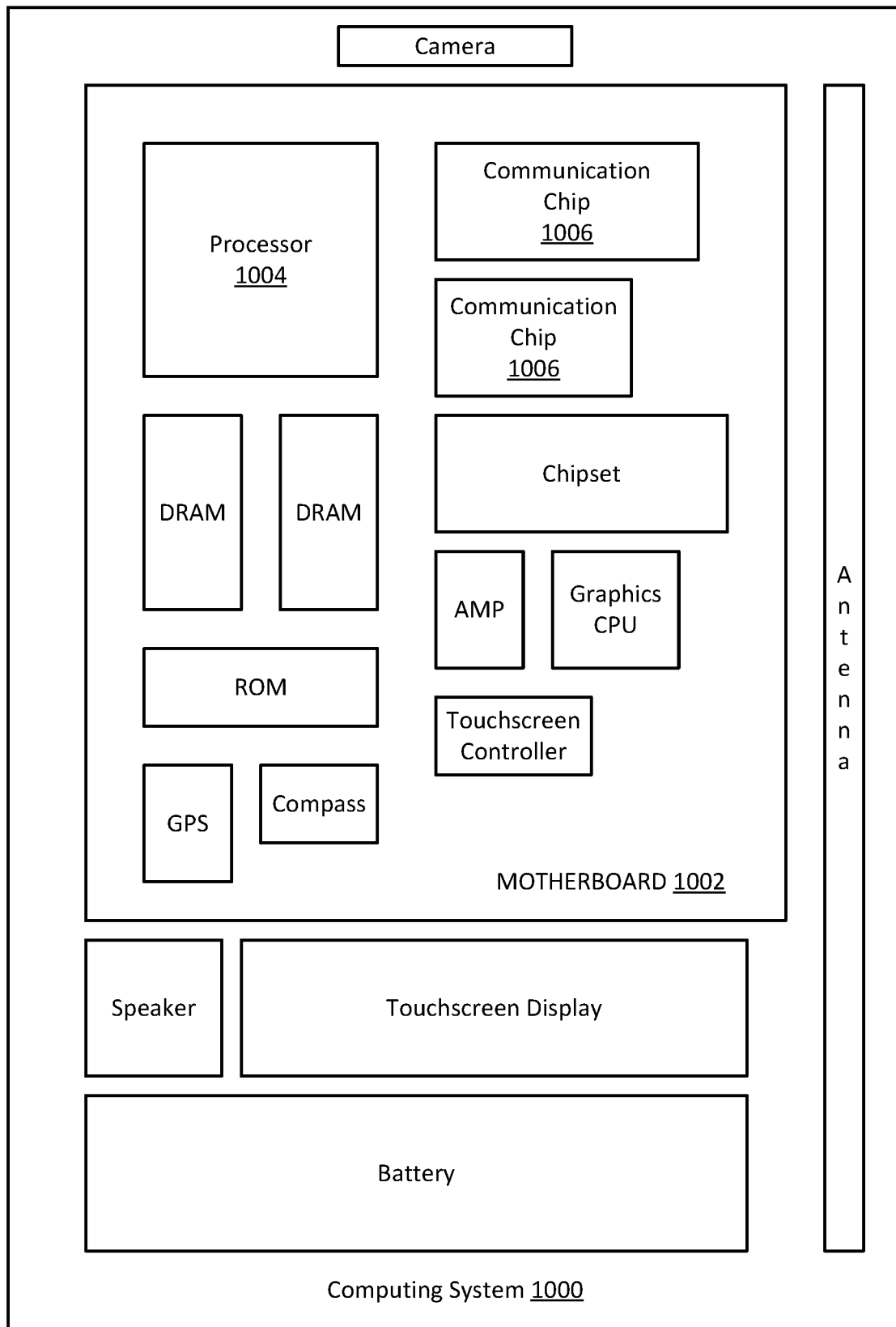
FIG. 6 illustrates a computing system implemented with integrated circuit structures or devices formed using the techniques disclosed herein, in accordance with some embodiments of this disclosure.

FIG. 6 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more RF switch transistors as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a gate stack including a gate dielectric layer, a ferroelectric layer, and a gate electrode, wherein the ferroelectric layer is between the gate dielectric layer and the gate electrode, and wherein the ferroelectric layer includes ferroelectric material; spacers adjacent to both sides of the gate stack; a channel region below the gate stack, wherein the gate dielectric layer is between the channel region and the ferroelectric layer; and source and drain (S/D) regions adjacent to the channel region.

Example 2 includes the subject matter of Example 1, wherein the channel region includes group III-V semiconductor material.

Example 3 includes the subject matter of any of Examples 1-2, wherein the channel region includes gallium and nitrogen.

Example 4 includes the subject matter of any of Examples 1-3, further including a polarization charge inducing layer between the channel region and the gate dielectric layer.

Example 5 includes the subject matter of Example 4, wherein the polarization charge inducing layer includes aluminum and nitrogen.

Example 6 includes the subject matter of any of Examples 1-5, wherein the S/D regions include indium and nitrogen.

Example 7 includes the subject matter of any of Examples 1-6, wherein material of the S/D regions is n-type doped.

Example 8 includes the subject matter of any of Examples 1-7, wherein the ferroelectric material includes $Hf_xZr_yO$.

Example 9 includes the subject matter of any of Examples 1-8, wherein the ferroelectric material includes at least one of $PbZrO_3$, $PbTiO_3$, $PbZr_xTi_{1-x}O_3$, $Ba_xSr_{1-x}TiO_3$, $SrBi_2Ta_2O_9$, $BiLa_4Ti_3O_{12}$, $BaMgF_4$, $Bi_4Ti_3O_{12}$, and $Pb_5Ge_3O_{11}$.

Example 10 includes the subject matter of any of Examples 1-9, wherein the ferroelectric layer has a thickness between the gate dielectric layer and the gate electrode of 5 to 20 nm.

Example 11 includes the subject matter of any of Examples 1-10, wherein the ferroelectric layer is between the gate electrode and each of the spacers.

Example 12 includes the subject matter of any of Examples 1-10, wherein the ferroelectric layer is not between the gate electrode and either of the spacers.

Example 13 includes the subject matter of any of Examples 1-12, wherein the gate dielectric layer is above at least a portion of each of the S/D regions.

Example 14 includes the subject matter of any of Examples 1-13, wherein the transistor has a planar configuration.

Example 15 includes the subject matter of any of Examples 1-13, wherein the transistor has a non-planar configuration.

Example 16 is a radio frequency (RF) switch device including the subject matter of any of Examples 1-15.

Example 17 is a computing system including the subject matter of any of Examples 1-16.

Example 18 is a radio frequency (RF) switch transistor including: a gate stack including a gate dielectric layer, a ferroelectric layer, and a gate electrode, wherein the ferroelectric layer is between the gate dielectric layer and the gate electrode, and wherein the ferroelectric layer includes ferroelectric material; spacers adjacent to both sides of the gate stack; a channel region below the gate stack, the channel region including group III-V semiconductor material, wherein the gate dielectric layer is between the channel region and the ferroelectric layer; a polarization charge inducing layer between the channel region and the gate stack; and source and drain (S/D) regions adjacent to the channel region.

Example 19 includes the subject matter of Example 18, wherein the channel region includes gallium and nitrogen.

Example 20 includes the subject matter of any of Examples 18-19, wherein the polarization charge inducing layer includes aluminum and nitrogen.

Example 21 includes the subject matter of any of Examples 18-20, wherein the S/D regions include indium and nitrogen.

Example 22 includes the subject matter of any of Examples 18-21, wherein material of the S/D regions is n-type doped.

Example 23 includes the subject matter of any of Examples 18-22, wherein the ferroelectric material includes $Hf_xZr_yO$.

Example 24 includes the subject matter of any of Examples 18-23, wherein the ferroelectric material includes at least one of $PbZrO_3$, $PbTiO_3$, $PbZr_xTi_{1-x}O_3$, $Ba_xSr_{1-x}TiO_3$, $SrBi_2Ta_2O_9$, $BiLa_4Ti_3O_{12}$, $BaMgF_4$, $Bi_4Ti_3O_{12}$, and $Pb_5Ge_3O_{11}$.

Example 25 includes the subject matter of any of Examples 18-24, wherein the ferroelectric layer has a thickness between the gate dielectric layer and the gate electrode of 5 to 20 nm.

Example 26 includes the subject matter of any of Examples 18-25, wherein the ferroelectric layer is between the gate electrode and each of the spacers.

Example 27 includes the subject matter of any of Examples 18-25, wherein the ferroelectric layer is not between the gate electrode and either of the spacers.

Example 28 includes the subject matter of any of Examples 18-27, wherein the gate dielectric layer is above at least a portion of each of the S/D regions.

Example 29 includes the subject matter of any of Examples 18-28, wherein the transistor has a planar configuration.

Example 30 includes the subject matter of any of Examples 18-28, wherein the transistor has a non-planar configuration.

Example 31 is a computing system including the subject matter of any of Examples 18-30.

Example 32 is a method of forming a transistor, the method including: forming a gate dielectric layer above a channel region; forming a ferroelectric layer above the gate dielectric layer, the ferroelectric layer including ferroelectric material, wherein the gate dielectric layer is between the channel region and the ferroelectric layer; forming a gate electrode above the ferroelectric layer, wherein the ferroelectric layer is between the gate electrode and the gate dielectric layer; forming spacers adjacent to both sides of the gate stack; and forming source and drain (S/D) regions adjacent to the channel region.

Example 33 includes the subject matter of Example 32, wherein forming the ferroelectric layer includes depositing the ferroelectric material using an atomic layer deposition (ALD) process.

Example 34 includes the subject matter of any of Examples 32-33, wherein the channel region includes group III-V semiconductor material.

Example 35 includes the subject matter of any of Examples 32-34, wherein the channel region includes gallium and nitrogen.

Example 36 includes the subject matter of any of Examples 32-35, further including forming a polarization charge inducing layer between the channel region and the gate dielectric layer.

Example 37 includes the subject matter of Example 36, wherein the polarization charge inducing layer includes aluminum and nitrogen.

Example 38 includes the subject matter of any of Examples 32-37, wherein the S/D regions include indium and nitrogen.

Example 39 includes the subject matter of any of Examples 32-38, wherein material of the S/D regions is n-type doped.

Example 40 includes the subject matter of any of Examples 32-39, wherein the ferroelectric material includes $Hf_xZr_yO$.

Example 41 includes the subject matter of any of Examples 32-40, wherein the ferroelectric material includes at least one of $PbZrO_3$, $PbTiO_3$, $PbZr_xTi_{1-x}O_3$, $Ba_xSr_{1-x}TiO_3$, $SrBi_2Ta_2O_9$, $BiLa_4Ti_3O_{12}$, $BaMgF_4$, $Bi_4Ti_3O_{12}$, and $Pb_5Ge_3O_{11}$.

Example 42 includes the subject matter of any of Examples 32-41, wherein the ferroelectric layer has a thickness between the gate dielectric layer and the gate electrode of 5 to 20 nm.

Example 43 includes the subject matter of any of Examples 32-42, wherein the ferroelectric layer is between the gate electrode and each of the spacers.

Example 44 includes the subject matter of any of Examples 32-42, wherein the ferroelectric layer is not between the gate electrode and either of the spacers.

Example 45 includes the subject matter of any of Examples 32-44, wherein the gate dielectric layer is above at least a portion of each of the S/D regions.

Example 46 includes the subject matter of any of Examples 32-45, wherein the transistor is a radio frequency (RF) switch transistor.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
    a gate structure including a gate electrode and a gate dielectric, the gate electrode having at least a first layer that includes silicon and a second layer that includes titanium and nitrogen;
    a ferroelectric layer directly between the gate dielectric and at least part of the gate electrode;
    a base layer comprising semiconductor material, wherein the gate dielectric is above the base layer; and
    a charge inducing polarization layer on the base layer, wherein the gate dielectric is on the charge inducing polarization layer.

2. The integrated circuit structure of claim 1, wherein the base layer comprises a material selected from the group consisting of: silicon, germanium, silicon germanium, silicon carbide, gallium arsenide, indium gallium arsenide, gallium nitride, and indium gallium nitride.

3. The integrated circuit structure of claim 1, wherein the gate dielectric is further on sidewalls of the gate electrode.

4. The integrated circuit structure of claim 1, further comprising:
    a first spacer at a first side of the gate electrode; and
    a second spacer at a second side of the gate electrode, the second side opposite the first side;
    the first and second spacers comprising insulator material.

5. The integrated circuit structure of claim 1, wherein the gate dielectric does not laterally extend beyond the ferroelectric layer.

6. The integrated circuit structure of claim 1, wherein the ferroelectric layer has a thickness between 1 and 20 nanometers, and the gate dielectric has a thickness between 0.1 and 10 nanometers, the ferroelectric layer being thicker than the gate dielectric.

7. The integrated circuit structure of claim 1, wherein the gate dielectric comprises hafnium, and the first layer comprises polysilicon.

8. The integrated circuit structure of claim 1, further comprising a metal-oxide-semiconductor (MOS) transistor that includes the gate structure and ferroelectric layer.

9. An integrated circuit structure, comprising:
    a gate structure including a gate dielectric layer, a ferroelectric layer, and a gate electrode, the ferroelectric layer between the gate dielectric layer and the gate electrode, the gate dielectric layer including one or more high-k dielectrics, the ferroelectric layer including one or more ferroelectric materials, the gate electrode including a multilayer structure comprising silicon in at least one of the layers of the multilayer structure, and nitrogen and titanium in at least one of the layers of the multilayer structure;

a first spacer and a second spacer, at least a portion of the gate electrode between the first and second spacers, the first and second spacers including one or more dielectrics;

a base layer at least partially between portions of the gate structure, the base layer including one or more semiconductor materials;

a charge inducing polarization layer on the base layer, wherein the gate dielectric layer is on the charge inducing polarization layer; and a source region and a drain region, at least a portion of the base layer between the source and drain regions, the source and drain regions including one or more semiconductor materials.

10. The integrated circuit structure of claim 9, wherein the ferroelectric layer is directly between the gate dielectric layer and a bottom surface of the gate electrode.

11. An integrated circuit structure, comprising:

a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure, wherein the first layer has a thickness between 1 and 10 nanometers, and the second layer is thicker than the first layer;

a first spacer and a second spacer, at least a portion of the gate electrode between the first and second spacers, the first and second spacers including one or more insulators;

a base layer below and at least partially laterally between portions of the gate structure, the base layer including one or more semiconductor materials; and a fourth layer between the base layer and the gate structure, the fourth layer including aluminum and nitrogen.

12. The integrated circuit structure of claim 11, wherein the one or more semiconductor materials included in the base layer includes one or more of silicon, germanium, and carbon, the integrated circuit structure further comprising:

a source region and a drain region, at least a portion of the base layer between the source and drain regions, the source and drain regions including one or more semiconductor materials.

13. The integrated circuit structure of claim 11, wherein the one or more semiconductor materials included in the base layer includes nitrogen and one or more of gallium, indium, and aluminum.

14. The integrated circuit structure of claim 11, further wherein the second layer is directly between the first layer and a bottom surface of the gate electrode and not on sidewalls of the gate electrode.

15. The integrated circuit structure of claim 11, wherein the transistor has a finFET configuration or a gate-all-around configuration, the integrated circuit structure further comprising:

a source region and a drain region, at least a portion of the base layer between the source and drain regions, the source and drain regions including one or more semiconductor materials.

16. The integrated circuit structure of claim 11, wherein the metal is titanium, and the multilayer structure of the gate electrode includes a first layer comprising polysilicon and a second layer comprising titanium and nitrogen.

17. An integrated circuit structure, comprising:

a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure;

a first spacer and a second spacer, at least a portion of the gate electrode between the first and second spacers, the first and second spacers including one or more insulators;

a base layer below and at least partially laterally between portions of the gate structure, the base layer including one or more semiconductor materials, wherein the one or more semiconductor materials included in the base layer includes nitrogen and one or more of gallium, indium, and aluminum; and a charge inducing polarization layer on the base layer, wherein the first layer of the gate structure is on the charge inducing polarization layer.

18. An integrated circuit structure, comprising:

a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure;

a first spacer and a second spacer, at least a portion of the gate electrode between the first and second spacers, the first and second spacers including one or more insulators;

a base layer below and at least partially laterally between portions of the gate structure, the base layer including one or more semiconductor materials; and a layer between the base layer and the gate structure, the layer including aluminum and nitrogen.

19. An integrated circuit structure, comprising:

a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure, wherein the second layer is directly between the first layer and a bottom surface of the gate electrode and not on sidewalls of the gate electrode;

a first spacer and a second spacer, at least a portion of the gate electrode between the first and second spacers, the first and second spacers including one or more insulators;

a base layer below and at least partially laterally between portions of the gate structure, the base layer including one or more semiconductor materials; and a charge inducing polarization layer on the base layer, wherein the first layer of the gate structure is on the charge inducing polarization layer.

20. An integrated circuit structure, comprising:

a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure;
a first spacer and a second spacer, at least a portion of the gate electrode between the first and second spacers, the first and second spacers including one or more insulators; and
a base layer below and at least partially laterally between portions of the gate structure, the base layer including one or more semiconductor materials, wherein the transistor has a finFET configuration or a gate-all-around configuration, the integrated circuit structure further comprising:
a source region and a drain region, at least a portion of the base layer between the source and drain regions, the source and drain regions including one or more semiconductor materials.

21. An integrated circuit structure, comprising:
a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure, wherein the metal is titanium, and the multilayer structure of the gate electrode includes a first layer comprising polysilicon and a second layer comprising titanium and nitrogen;
a first spacer and a second spacer, at least a portion of the gate electrode between the first and second spacers, the first and second spacers including one or more insulators;

a base layer below and at least partially laterally between portions of the gate structure, the base layer including one or more semiconductor materials; and
a charge inducing polarization layer on the base layer, wherein the first layer of the gate structure is on the charge inducing polarization layer.

22. An integrated circuit structure, comprising:
a gate structure including a first layer, a second layer, and a gate electrode, the second layer directly between the first layer and at least part of the gate electrode, the first layer including one or more high-k dielectrics, the second layer including one or more ferroelectric materials, and the gate electrode including a multilayer structure comprising a metal in at least one of the layers of the multilayer structure, wherein the first layer has a thickness between 1 and 10 nanometers, and the second layer is thicker than the first layer;
a first spacer and a second spacer, at least a portion of the gate electrode between the first and second spacers, the first and second spacers including one or more insulators; and
a base layer below and at least partially laterally between portions of the gate structure, the base layer including one or more semiconductor materials, wherein the integrated circuit structure has a finFET configuration or a gate-all-around configuration, the integrated circuit structure further comprising:
a source region and a drain region, at least a portion of the base layer between the source and drain regions, the source and drain regions including one or more semiconductor materials.

* * * * *